(12) United States Patent  
Rasetto et al.

(10) Patent No.: US 12,152,344 B2
(45) Date of Patent: Nov. 26, 2024

(54) MULTI-METAL LAYER WVTR BARRIER PRODUCTS ON WATER VAPOUR AND OXYGEN PERMEABLE BIO-BASED SUBSTRATES

(71) Applicant: AR METALLIZING N.V., Genk (BE)

(72) Inventors: Valeria Rasetto, Vigone (IT); Daniela Mondelli, Turin (IT); Roghaiyeh Ebrahimi Kalan, Bellingham, MA (US); Kurt Gundlach, Warren, MA (US)

(73) Assignee: AR METALLIZING N.V., Genk (BE)

( * ) Notice: Subject to any disclaimer, the term of this patent is extended or adjusted under 35 U.S.C. 154(b) by 26 days.

(21) Appl. No.: 17/631,569

(22) PCT Filed: Jul. 31, 2020

(86) PCT No.: PCT/EP2020/071671
§ 371 (c)(1),
(2) Date: Jan. 31, 2022

(87) PCT Pub. No.: WO2021/023661
PCT Pub. Date: Feb. 11, 2021

(65) Prior Publication Data
US 2022/0275582 A1 Sep. 1, 2022

(30) Foreign Application Priority Data

Aug. 2, 2019 (EP) ..................................... 19189748

(51) Int. Cl.
*D21H 19/08* (2006.01)
*B05D 7/00* (2006.01)
(Continued)

(52) U.S. Cl.
CPC ............... *D21H 19/08* (2013.01); *B05D 7/00* (2013.01); *B05D 7/02* (2013.01); *B05D 7/14* (2013.01);
(Continued)

(58) Field of Classification Search
CPC ........ D21H 27/30; D21H 27/10; D21H 19/08; D21H 19/02; D21H 19/82; D21H 19/824;
(Continued)

(56) References Cited

U.S. PATENT DOCUMENTS

| | | | |
|---|---|---|---|
| 4,309,319 A * | 1/1982 | Vaughn, Jr. .......... | C09D 183/04 524/588 |
| 2010/0143710 A1* | 6/2010 | Dickey ................ | C23C 16/405 427/535 |

(Continued)

FOREIGN PATENT DOCUMENTS

| | | |
|---|---|---|
| EP | 0437946 A2 | 7/1991 |
| JP | 2002361778 A | 12/2002 |
| WO | 2012175621 A1 | 12/2012 |

OTHER PUBLICATIONS

Dang et al., "Hydrophobic Noncrystalline Porous Starch (NCPS): Dispersed Silver Nanoparticle Suspension as an Antibacterial Coating for Packaging Paper" in BioResources, 13(1), pp. 192-207, Nov. 2017. (Year: 2017).*

(Continued)

*Primary Examiner* — Michael E. La Villa
(74) *Attorney, Agent, or Firm* — Dorsey & Whitney LLP

(57) ABSTRACT

The invention relates to a metallized multilayer sheet material for packaging having a water vapour transmission rate of below 5 g/m²/day at 38° C. RH:90% comprising:
  a water vapour permeable sheet substrate, and
  at least two metallized layers, each covered directly by a solvent based polymeric coating layer,
(Continued)

wherein the cumulated metallized layers have an optical density of at least 2.5 and/or a thickness of at least 15 nm.

13 Claims, 3 Drawing Sheets

(51) Int. Cl.
| | |
|---|---|
| B05D 7/02 | (2006.01) |
| B05D 7/14 | (2006.01) |
| B05D 7/26 | (2006.01) |
| B32B 15/04 | (2006.01) |
| B32B 15/08 | (2006.01) |
| B32B 15/09 | (2006.01) |
| B32B 15/10 | (2006.01) |
| B32B 15/12 | (2006.01) |
| B32B 15/14 | (2006.01) |
| C23C 14/02 | (2006.01) |
| C23C 14/14 | (2006.01) |
| C23C 14/20 | (2006.01) |
| C23C 14/24 | (2006.01) |
| C23C 28/00 | (2006.01) |
| C23C 30/00 | (2006.01) |
| D21H 19/02 | (2006.01) |
| D21H 19/82 | (2006.01) |
| D21H 27/30 | (2006.01) |
| D21H 27/10 | (2006.01) |

(52) U.S. Cl.
CPC ............. *B05D 7/26* (2013.01); *B05D 7/50* (2013.01); *B05D 7/52* (2013.01); *B05D 7/56* (2013.01); *B32B 15/04* (2013.01); *B32B 15/043* (2013.01); *B32B 15/08* (2013.01); *B32B 15/09* (2013.01); *B32B 15/10* (2013.01); *B32B 15/12* (2013.01); *B32B 15/14* (2013.01); *C23C 14/02* (2013.01); *C23C 14/024* (2013.01); *C23C 14/025* (2013.01); *C23C 14/14* (2013.01); *C23C 14/20* (2013.01); *C23C 14/24* (2013.01); *C23C 28/00* (2013.01); *C23C 28/42* (2013.01); *C23C 28/44* (2013.01); *C23C 30/00* (2013.01); *D21H 19/02* (2013.01); *D21H 19/82* (2013.01); *D21H 27/30* (2013.01); *B05D 2202/00* (2013.01); *B05D 2203/22* (2013.01); *B05D 2350/65* (2013.01); *D21H 19/824* (2013.01); *D21H 27/10* (2013.01); *Y10T 428/12438* (2015.01); *Y10T 428/12556* (2015.01); *Y10T 428/12569* (2015.01); *Y10T 428/12993* (2015.01); *Y10T 428/24942* (2015.01); *Y10T 428/2495* (2015.01); *Y10T 428/24967* (2015.01); *Y10T 428/26* (2015.01); *Y10T 428/263* (2015.01); *Y10T 428/264* (2015.01); *Y10T 428/265* (2015.01); *Y10T 428/268* (2015.01)

(58) Field of Classification Search
CPC ........ B05D 2350/65; B05D 7/50; B05D 7/14; B05D 7/26; B05D 7/52; B05D 7/56; B05D 7/00; B05D 7/02; B05D 2203/22; B05D 2202/00; C23C 14/02; C23C 14/024; C23C 14/20; C23C 14/24; C23C 14/025; C23C 14/14; C23C 28/00; C23C 28/42; C23C 28/44; C23C 30/00; B32B 15/04; B32B 15/043; B32B 15/08; B32B 15/09; B32B 15/10; B32B 15/12; B32B 15/14; Y10T 428/12556; Y10T 428/12569; Y10T 428/12438; Y10T 428/12993; Y10T 428/2495; Y10T 428/24942; Y10T 428/24959; Y10T 428/24967; Y10T 428/26; Y10T 428/263; Y10T 428/264; Y10T 428/265; Y10T 428/268
See application file for complete search history.

(56) References Cited

U.S. PATENT DOCUMENTS

| | | |
|---|---|---|
| 2013/0340931 A1 | 12/2013 | Iwase |
| 2014/0322527 A1 | 10/2014 | Cho et al. |
| 2015/0337440 A1 | 11/2015 | Kim et al. |

OTHER PUBLICATIONS

International Search Report and Written Opinion from International Application No. PCT/EP2020/071671 mailed Sep. 1, 2020.

McClure, et al., "Evaporated aluminum on polyester: Optical and electrical properties as a function of thickness", Converting Quarterly, 2011, pp. 65-68.

* cited by examiner

MULTI-METAL LAYER WVTR BARRIER PRODUCTS ON WATER VAPOUR AND OXYGEN PERMEABLE BIO-BASED SUBSTRATES

FIELD OF THE INVENTION

The invention relates to a method to manufacture and the use of metallized multilayer sheet material having a reduced Water Vapour Transmission Rate for use in packaging water sensitive equipment or foodstuff.

BACKGROUND OF THE INVENTION

Nanometer vacuum deposition of metals, metal alloys and metal oxides onto impervious fossil-based plastic films has been well documented to improve oxygen and water vapour barrier properties.

However, the use of metallized impervious fossil-based plastic films has come under pressure due the slow biodegradability, and hence gives environmental concerns.

On permeable substrates, bio-based readily biodegradable, such as cellulosic fibrous papers, cellulosic films, polylactic acid and others, nanometer deposition of metals, metal alloys and metal oxides were much less effective than on plastic films in achieving water vapour and oxygen barrier levels sufficient for the food and sensitive instrument parts packaging industries where a WVTR (Water Vapour Transmission Rate) should be around 1 g/m$^2$/day at 38° C. in a relative humidity (RH) of 90%. Impervious plastic films already have appreciable WVTR & OTR (Oxygen Transmission Rate) barrier properties prior to enhancement with nanometer metal deposition. Minimal damage occurs to the deposited metal barrier layer on films due to clean room handling and smooth backside surface contact upon winding prior to bare metal overcoating protection. Although vacuum deposition of layers of above 20 nm of metals, metal alloys and metal oxides onto permeable renewable biodegradable substrates can impart adequate water vapour barrier performance, acceptable barrier performances can be reached only by carefully selecting the best sampled areas with a high degree of homogeneity of metal layer and free of scratches through the metal layer. Moreover, even on those selected samples the variability in water vapour barrier loss due to imperfections in the metal layer increases to the extent of not meeting required packaging performance due to paper dust on the pre-metal surface falling off after metallization leaving a metal pinhole as well as metal layer damage from the rough paper backside abrasion upon winding prior to protective post-metal coating.

The applicant has therefore deemed it necessary to propose a new metallized material incorporating a permeable substrate, possibly bio-based biodegradable, having reduced water vapour transmission rate (WVTR) variability which meets required packaging performance.

BRIEF SUMMARY OF THE INVENTION

To this purpose, the invention relates to a process for preparing a metallized multilayer sheet material for packaging having a WVTR of below 5 g/m/day at 38° C. RH:90% comprising:
  applying onto a water vapour permeable sheet substrate at least two metallized layers,
  applying a solvent based polymeric coating(s) directly onto the metallized layers, and
  drying the polymeric coatings,
wherein the cumulated metallized layers have an optical density (OD) of at least 2.5 and/or a thickness of at least 15 nm.

Packaging here refers to wrapping, packing, overpacking or covering macroscopic objects or food products, sensitive to humidity and intends to exclude the micro or nanoelectronics applications.

The invention also relates to the product directly obtained by the process, which is a metallized multilayer sheet material having a WVTR of below 5 g/m$^2$/day at 38° C. RH:90% comprising:
  a water vapour permeable sheet substrate, and
  at least two metallized layers, each covered directly with a dried solvent based polymeric coating layer(s),
wherein the cumulated metallized layers have an optical density (OD) of at least 2.5 and/or a thickness of at least 15 nm.

Preferably, when the sheet substrate has a rough surface, i.e. not smooth enough to reliably apply a homogeneous metallic layer, the sheet material of the invention further comprises a dried solvent based polymeric coating applied directly onto one or both sides of the sheet substrate wherein a metallized layer is applied (to the one or both sides). For example, the substrate could be smooth due to the presence of a permeable biofilm (bio-based polymers, like PLA films, cellulosic films or others . . . , preferably biodegradable) surface allowing for homogeneous metal deposition to be accomplished which is characterized by adequate adhesion.

Preferably, the metallized multilayer sheet material of the invention has a WVTR of below 3 g/m$^2$/day at 38° C. RH: 90% and still preferably below 1.5 g/m$^2$/day at 38° C. RH: 90%.

The steps of the method of the invention are not meant to be performed in the recited sequence. Metallization and polymer coating can be performed alternatively. Additional steps can also be performed. For example, several layers of solvent based coatings can be applied onto each other, to confer various properties to the material.

Furthermore, the metallized multilayer sheet material of the invention can also be obtained by laminating on top of each other two or more sheets, each sheet possibly containing none, one or more metallized layers. When using lamination, the material obtained comprises two water vapour permeable sheet substrates and at least two metallized layers.

Lamination can be performed with identical or different metallized sheets. When similar sheets are used, they can be assembled in a symmetrical or unsymmetrical manner.

In some embodiments, the metallized layers are on the same side of the substrate. In that case, a dried solvent based polymeric coating is applied directly onto the side of the sheet substrate wherein the metallized layers are applied. In other embodiments, the metallized layers are on opposite sides of the substrate. In that case, dried solvent based polymeric coatings are applied directly onto both sides of the sheet substrate wherein the metallized layers are applied.

The optical density (OD) of the cumulated metallized layers refers to an optical density measured without taking the substrate into account. The optical density is measured by the well-known method of measurement with a calibrated densitometer. Preferably, the cumulated metallized layers have an optical density (OD) comprised between 2.5 and 6.5, still preferably between 3 and 4. Preferably, the cumulated metallized layers have a thickness comprised between 15 nm and 100 nm, still preferably between 20 nm and 50 nm.

Typically, the water vapour permeable substrate has a water vapour barrier of over 150 g/m$^2$/day at 38° C. and 90% RH, and still preferably 100 g/m$^2$/day at 38° C. and 90% RH.

Depending on the nature of the water vapour permeable substrate, the process can comprise a first step of applying a solvent polymeric coating(s) onto one or both sides of the substrate, followed by a solvent evaporation step(s), prior to depositing a metallized layer. For example, when the substrate is a cellulosic paper or a substrate with a rough surface topology, it aids in achieving a smoothed continuous surface for improved adhesion and homogeneity of the deposited metallized layer. Some commercially available water vapour permeable substrates are already coated with a mineral filler in a latex binder matrix on one side (C1S) or on both sides (C2S) inline on the specialty paper products paper mills manufacturing equipment.

Preferably, the method of the invention comprise a first step of applying a solvent polymeric coating(s) onto one or both sides of the substrate, followed by a solvent evaporation step(s), prior to depositing a metallized layer, when the substrate is not already provided or acquired with such a layer, by the user of the method of the invention.

The solvent based coating refers to either a polymer dissolved in an organic solvent or an aqueous polymeric emulsion or dispersion when it is applied, and which is subsequently dried by evaporation of the solvent (organic, water or mixed), in order to achieve adequate adhesion of the metal and obtain the desired WVTR barrier performance. The top or outermost layer serves to protect the metal from a high propensity for abrasion damage, which would increase the variability of water vapour barrier performance.

The metallized multilayer sheet material of the invention can comprise more than two metallized layers, provided that a solvent based polymeric coated and dried layer(s) or the permeable sheet substrate is separating the two or more consecutive metallized layers, the outermost of which have a solvent based polymeric coated and dried protective layer(s).

The sheet substrate may be any suitable water vapour permeable material, preferably renewably sourced, flexible, for example paper which can be processed through production equipment applying coatings and metallization, as reels.

A metallized layer can be any metal selected from the group of aluminium, copper, tin, zinc, silver, gold, titanium, indium, silicon, and/or alloys and/or oxides and/or combinations thereof. It is preferably deposited by vacuum deposition, or by any other relevant technique well known to the skilled in the art. The thickness of a single metallized layer is preferably not thinner than 5 nm, rather not thinner than 10 nm, and not thicker than 100 nm, and preferably rather not thicker than 50 nm or 30 nm, or even 15 nm. Ideally, it has an optical density of between 1.5 and 6.0, preferably between 2.0 and 4.5, and still preferably between 2.5 and 3.5.

The metallized layers can be the same or different.

A solvent based polymeric coating layer can be any suitable coating, know to a person skilled in the art, suitable for the purpose of the final product. They can for example be acrylic polymer based, polyester polymer based, nitrocellulose based, polyvinyl acetate based or others. Each dried solvent based polymeric coating thickness is above 0.3 µm. This coating serves to confer homogeneity to the surface of the substrate and impart adequate adhesion of the metallized layer.

Preferably, it has a gram per square meter of between 0.3 and 6.0 to ensure proper protection of the metallized layer, while ensuring the flexibility of the sheet material.

Water based polymeric emulsion and dispersion layers can be applied at a thickness of above 0.5 µm and below 10 µm. They can serve to bring additional barrier properties, other than water vapour barrier, to the material, such as mineral oil barrier, oxygen barrier properties or scuffing resistance.

The process of the invention enables to obtain a flexible material, suitable to wrap food products or water sensitive products. The biodegradable metallized multilayer sheet material of the invention should have a water vapour transmission rate (WVTR) below 5 g/m$^2$/day at 38° C. RH:90%, and preferably below 2 g/m$^2$/day and still preferably below 1 g/m$^2$-day, and preferably in all areas of the finished reel utilized for producing packaging structures. Such a good water vapour barrier performance is reached by applying multiple metal layers (at least two), whose thicknesses sum is above 20 nanometres, separated by dried solvent based polymeric coatings. It is well known in the field that an effective water barrier, on a water vapour permeable substrate, could only be achieved by the presence of a thick metallized layer having an optical density (OD) of above 2.4. However, the applicant has demonstrated that a statistically reduced variability of the water barrier properties over the area can be achieved by applying at least two distinct metallized layers, separated by solvent evaporated polymeric coatings and/or a substrate, having a final structure OD above 2.4 and preferably below 6.0.

The functionally increased water vapour barrier full surface area performance of the packaging material of the invention was hypothesized to come from the scientific concept that the individual localized areas of damage that may be present in a given metallized layer do not line up with those defects in the other metallized layer(s), thus creating a tortuous or impeded path for water vapour migration through the entire sheet structure.

The sheet material according to the invention is for use as packaging sheet, for example to package food material sensitive to humidity, or any non-food material also sensitive to humidity and/or oxygen, like chemicals, elements for electronic devices, or non-electronic devices. The packaging sheet of the invention can be used to manufacture any type of packaging like containers, boxes, bags, trays, bottles, cups, or having any shape for the intended application using usual techniques such as folding, cutting, gluing, heat sealing, pressing, etc. . . . the only limitation being that the packaging manufacturing process should not degrade or alter the properties of the sheet. The packaging can be fully or partially made with the sheet material of the invention. It can for example be used for the whole box or for the sealing sheet of a tray or for the lid of a cup.

Such packaging can typically be cubic, parallelepiped, cylindrical, or have any other suitable shape. To manufacture of such packaging, the sheet of the invention can be reinforced with or associated to one or several additional layers, for example cardboard or paper, to ensure sufficient rigidity for conservation of the shape.

BRIEF DESCRIPTION OF THE SEVERAL VIEWS OF THE DRAWINGS

The invention will be better understood with the following description of several examples, referring to the accompanying drawing on which.

DETAILED DESCRIPTION

The metal layer used in the examples below is aluminium, the thickness of the metal layers has been correlated to the Optical Density, as well known to a person skill in the art (*see for example* McClure, D. J.; Copeland, N. Evaporated Aluminium on Polyester: Optical, Electrical, and Barrier Properties as a Function of Thickness and Time (Part II). Available online: http://dnn.convertingquarterly.com/Portals/1/files/matteucci-awards/2010-Evapourated-Aluminum-on-Polyester-p2.pdf)

The relationship between OD and thickness is not linear but is well established for a number of materials.

While OD can easily be measured for aluminium layers, as disclosed in the examples below, a person skilled in the art knows that other deposited layers, like for example metal oxides, for which their deposition thickness cannot be reliably quantified by OD measurement, other physical methods can be effectively applied to measure the thickness.

Units in $g/m^2/day$ is equivalent to $g\ H_2O/m^2/day$.

Comparative Example 1—C1S

A multilayer metallized sheet material, according to the prior art, is prepared as follows:

A first layer of acrylic polymer dissolved into ethyl acetate was applied on the clay coated side of UPM LabelCoat™ 60 gsm C1S base paper, resulting in 1.8 gsm (1.5 µm) acrylic polymer on the paper after ethyl acetate solvent was evaporated by oven drying from the substrate.

An aluminium layer such that the final product after metallization will have an OD 3.5-4.0 was deposited on the dry acrylic polymer layer, by chemical vapour deposition.

A second layer of the acrylic polymer coating was applied on the aluminium layer, to protect the aluminium layer from abrasion damage, where the amount of dried acrylic polymer on the structure was around 1 gsm (0.8-1.2 µm thickness) after the solvent was evaporated from the substrate by oven drying.

This material represents the prior art, where only one thick metal layer is present in the sheet material, with an OD>2.5.

The material was characterized by WVTR values between 5.22 and 12.36 g-/m²/day, showing a variability ($\Delta$)=7.14 g/m²/day with an average=8.56 g $H_2O/m^2/day$ measured at 38° C. and relative humidity 90% on six selected samples.

Comparative Example 1A-C1S

Figure 1:
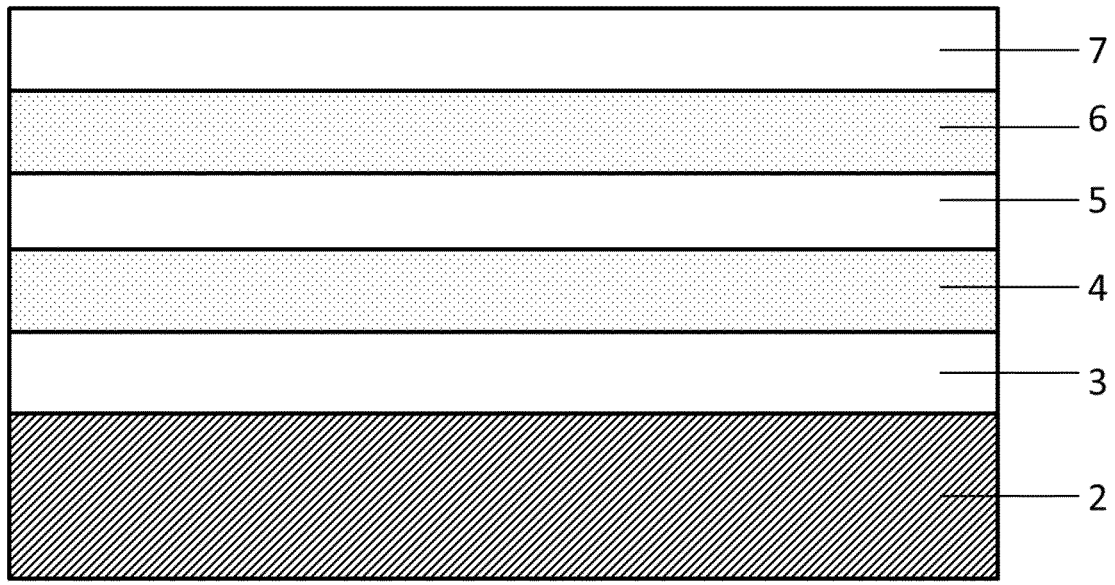
FIG. 1 illustrates a sheet material according to the invention where the metallized multilayer and other layers are on one side of the substrate

A single metallized layer sheet material, according to the prior art, is prepared as follows:

A first layer of polyester polymer coating dissolved into ethyl acetate was applied on the clay coated side of Pixelle Pointflex by 60 gsm C1S base paper, resulting in 1.1-1.3 gsm polyester polymer on the paper after ethyl acetate solvent was evaporated by oven drying from the substrate (FIG. 1, layer #3).

An aluminium layer such that the final product after metallization will have an OD 2.7-3.7 was deposited on the dry polyester polymer layer, by chemical vapour deposition (FIG. 1, layer #4).

A second layer of the polyester polymer coating was applied on the aluminium layer, to protect the aluminium layer from abrasion damage, where the amount of dried polyester polymer on the structure was around 1.0-1.1 gsm after the solvent was evaporated from the substrate by oven drying (FIG. 1, layer #5).

This material represents the prior art, where only one thick metal layer is present in the sheet material, with an OD>2.5.

The material was characterized by WVTR values between 2.15 and 6.72 g/m²/day, showing a variability $\Delta$=4.58 g $H_2O/m^2/day$ with an average=4.81 g/m²/day measured at 38° C. and relative humidity 90% on six selected samples.

Example 1 C1S

A multilayer metallized sheet material, as illustrated on FIG. 1, according to the present invention, was prepared as follows:

A first layer of polyester polymer dissolved into ethyl acetate was applied on the coated side of UPM Label-Coat™ 60 gsm C1S base paper (FIG. 1, layer #2), resulting in 0.8 gsm dried amorphous polyester polymer on the paper after ethyl acetate solvent was evaporated from the substrate (FIG. 1, layer #3).

An aluminium layer such that the final product after metallization will have an OD of approximately 2.5 was deposited on the dry polyester polymer layer by vacuum deposition (FIG. 1, layer #4).

A second layer of the polyester polymer coating was applied on the aluminium layer 4, to protect the aluminium layer from abrasion damage, where the amount of oven dried polyester polymer on the structure was around 0.8 gsm after ethyl acetate was evaporated from the substrate by oven drying (FIG. 1, layer #5).

A second aluminium layer was deposited on the dry polyester polymer layer 5 by vacuum deposition (FIG. 1, layer #6) under the same process and conditions as the first aluminium layer (though OD of this specific layer was not measured, it is expected to be similar to the first layer).

A third layer of polyester polymer coating was applied on the aluminium layer 6, to protect the aluminium layer from abrasion damage, where the amount of dried polyester polymer on the metal was around 0.8 gsm after ethyl acetate was evaporated from the structure by oven drying (FIG. 1, layer #7).

The total thickness of aluminium layers 4 and 6 amounts to an OD of 3.5-4.0. The material has WVTR values between 0.33 and 1.76 g/m²/day, showing a $\Delta$=1.43 g/m²/ day with an average=0.80 g/m²/day measured at 38° C. and relative humidity 90%, exhibiting superior average WVTR with significantly reduced variability among six randomly chosen test samples.

Example 1A C1S

A multilayer metallized sheet material, as illustrated on FIG. 1, according to the present invention, was prepared as follows:
  A first layer of polyester polymer dissolved into ethyl acetate was applied on the coated side of SAPPI Carlid 45 gsm C1S base paper (FIG. 1, layer #2), resulting in 0.8-1.2 gsm dried amorphous polyester polymer on the paper after ethyl acetate solvent was evaporated from the substrate (FIG. 1, layer #3).
  An aluminium layer having an OD of approximately 2.6 was deposited on the dry polyester polymer layer by vacuum deposition (FIG. 1, layer #4).
  A second layer of the polyester polymer coating was applied on the aluminium layer 4, to protect the aluminium layer from abrasion damage, where the amount of oven dried polyester polymer on the structure was around 0.9 gsm after ethyl acetate was evaporated from the substrate by oven drying (FIG. 1, layer #5).
  A second aluminium layer was deposited on the dry polyester polymer layer 5 by vacuum deposition (FIG. 1, layer #6) under the same process and conditions as the first aluminium layer (though OD of this specific layer was not measured, it is expected to be similar to the first layer).
  A third layer of polyester polymer coating was applied on the aluminium layer 6, to protect the aluminium layer from abrasion damage, where the amount of dried polyester polymer on the metal was around 0.8 gsm after ethyl acetate was evaporated from the structure by oven drying (FIG. 1, layer #7).

The total thickness of aluminium (FIG. 1, layers #4 and #6) amounts to an OD of 3.0-3.5. The material has WVTR values between 0.97 and 1.21 g/m²/day, showing a variability $\Delta$=0.24 g/m²/day with an average=1.08 g/m²/day measured at 38° C. and relative humidity 90%, exhibiting superior average WVTR with significantly reduced variability among six randomly chosen test samples.

Example 2 C1S

A multilayer metallized sheet material, comprising a sequence of layers as illustrated on FIG. 1, according to the present invention, was prepared as follows:
  A first layer of a water-based acrylic polymer emulsion at 25% solids coating was applied on the coated side of Aralar Aravac HWS 65 gsm C1S base paper 2 (FIG. 1, layer #2), leaving 1.6-1.8 gsm dried acrylic polymer on the paper C1S surface after water evaporation from the coating by oven drying (FIG. 1, layer #3).
  An aluminium layer 4 having an OD of approximately 2.0-2.5 was deposited on the dry acrylic polymer layer by vacuum deposition (FIG. 1, layer #4).
  A second layer of a water-based acrylic polymer emulsion at 25% solids coating was applied on the aluminium layer 4, to protect the aluminium layer from abrasion damage, where the amount of dried acrylic polymer on the metal was around 1.0 gsm after the water was evaporated by oven drying from the coating (FIG. 1, layer #5).
  A second aluminium layer was deposited on the dry acrylic polymer layer by vacuum deposition (FIG. 1, layer #6) under the same process and conditions as the first aluminium layer.
  A third layer of a water-based acrylic polymer emulsion at 25% solids coating was applied on the aluminium layer 6, to protect the aluminium layer from abrasion damage, where the amount of dried acrylic polymer on the metal was around 1.0 gsm after the water was evaporated by oven drying from the coating (FIG. 1, layer #7).

The total thickness of aluminium layers 4 and 6 amounts to an OD of 3.8-4.1. The material has WVTR values for the six random test samples was between 2.18 and 4.18 g/m²/day, showing a $\Delta$=2.00 g/m²/day with an average=2.83 g/m²/day measured at 38° C. and relative humidity 90%.

Comparative Examples 3A—and Examples 3B and 3C-C2S

Figure 2:
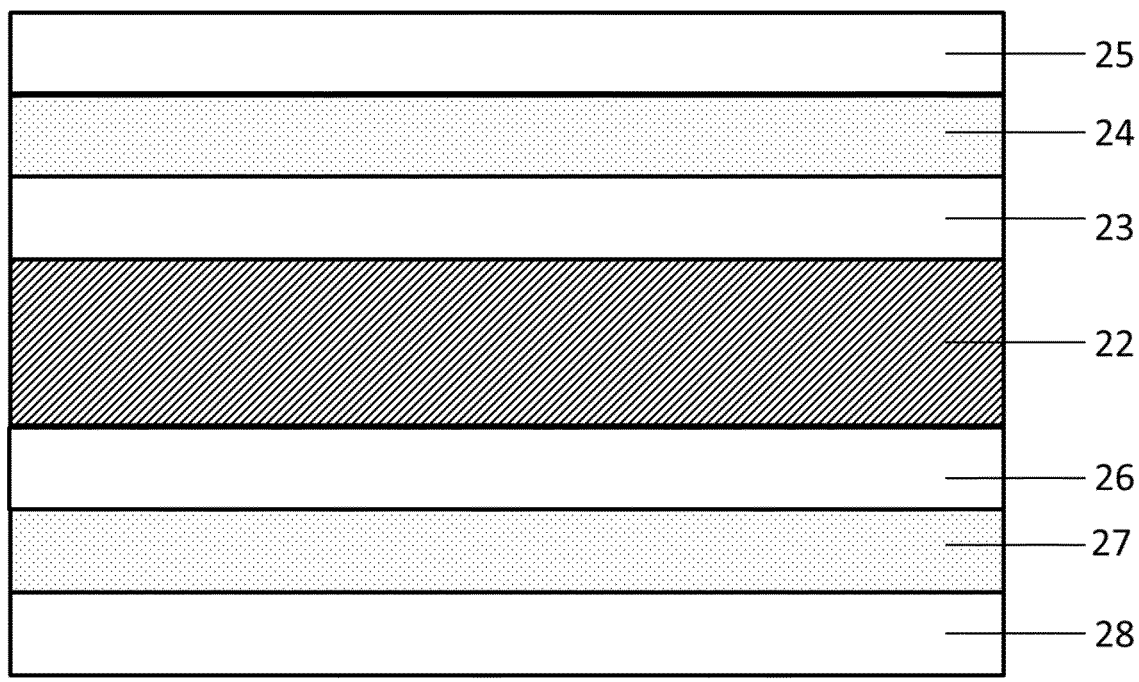
FIG. 2 illustrates a sheet material according to the invention where the metallized multilayers and related layers are on both sides of the substrate.

A single metallized sheet material (Comparative example 3A), is compared to multilayer metallized on one side of the sheet, comprising a sequence of layers as illustrated on FIG. 1 (example 3B) and to a multilayer metallized material where metal layers are deposited on each side of the substrate, comprising a sequence of layers as illustrated in FIG. 2 (example 3C), was prepared as follows:

Comparative Example 3A—Single Metallization with OD=3.8-4.2

Figure 3:
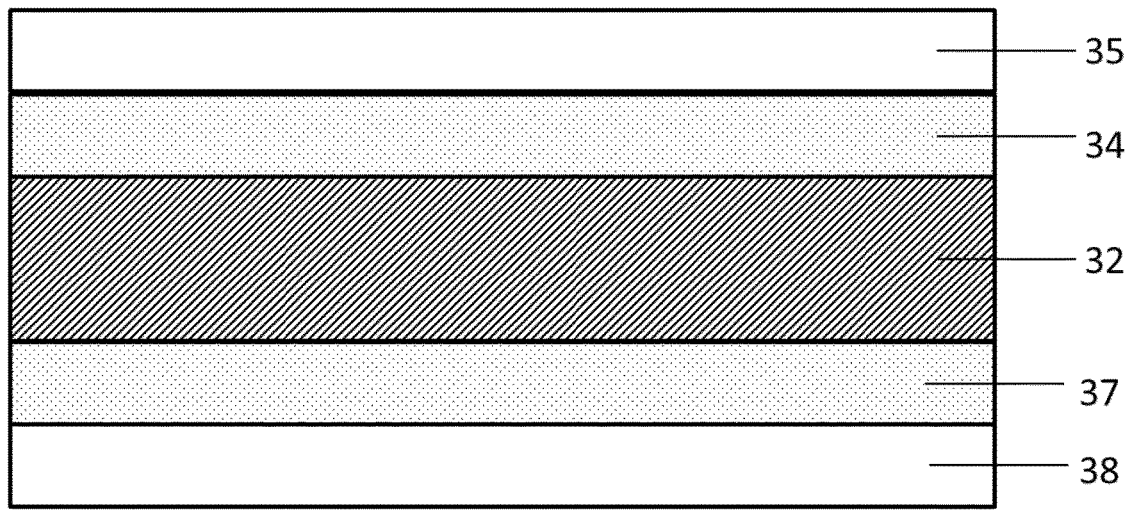
FIG. 3 illustrates another sheet material according to the invention.

A first layer of polyester polymer dissolved into ethyl acetate was applied on one side of ND Orion 98 gsm C2S base paper, resulting in 1.4 gsm dried amorphous polyester polymer on the paper after ethyl acetate solvent was evaporated from the substrate (FIG. 3, layer #23).
An aluminium layer having an OD of approximately 4.0 was deposited on the dry polyester polymer layer by vacuum deposition (FIG. 3, layer #24).
A second layer of a water-based acrylic polymer emulsion at 25% solids coating was applied on the aluminium layer, under the same process and conditions as the first aluminium layer, to protect the aluminium layer from abrasion damage, where the amount of dried acrylic polymer on the metal was around 2.0 gsm after the water was evaporated by oven drying from the coating (FIG. 3, layer #25).

This material represents the prior art, where only one thick metal layer is present in the sheet material. The material was characterized by WVTR values between 1.75 and >110 g (one sample over-ranged Permatran-W Model 3/61)/m²/day, showing a $\Delta$>108 g/m²/day with an average >20 g/m²/day measured at 38° C. and relative humidity 90% on six random test samples.

Example 3B—Double Metallization on One Side with OD=4.9-5.4, Sequence of Layers as on FIG. 1, was Prepared as Follows A first layer of polyester polymer dissolved into ethyl acetate was applied on one side of ND Orion 98 gsm C2S base paper (FIG. 1, layer #2), resulting in 1.4 gsm dried amorphous polyester polymer on the paper after ethyl acetate solvent was evaporated from the substrate by oven drying (FIG. 1, layer #3).

An aluminium layer having an OD of approximately 3.5 was deposited on the dry polyester polymer layer by vacuum deposition (FIG. 1, layer #4).

A second layer of the polyester polymer coating was applied on the aluminium layer 4, where the amount of oven dried polyester polymer on the structure was around 1.4 gsm after ethyl acetate was evaporated from the substrate by oven drying (FIG. 1, layer #5).

A second aluminium layer, having an OD of approximately 2.5, was deposited on the dry polyester polymer layer by vacuum deposition (FIG. 1, layer #6) under the same process and conditions as the first aluminium layer.

A third layer of a water-based acrylic polymer emulsion at 25% solids coating was applied on the aluminium layer, to protect the aluminium layer from abrasion damage, where the amount of dried acrylic polymer on the metal was around 1.0 gsm after the water was evaporated by oven drying from the coating (FIG. 1, layer #7).

The material was characterized by WVTR values between 0.12 and 0.26 g/m$^2$/day, showing a Δ=0.14 g/m$^2$/day with an average 0.20 g/m$^2$/day measured at 38° C. and relative humidity 90% with five random test samples.

Example 3C—Single Metallization's on Both Sides with OD=6.3-6.8, Sequence of Layers as Illustrated on FIG. 2, was Prepared as Follows A first layer of polyester polymer dissolved into ethyl acetate was applied on one side of ND Orion 98 gsm C2S base paper (FIG. 2, layer #22), resulting in 1.4 gsm dried amorphous polyester polymer was on the paper after ethyl acetate solvent was evaporated from the substrate by oven drying (FIG. 2, layer #23).

A second layer of polyester polymer dissolved into ethyl acetate was applied on other side of the first side coated ND Orion 98 gsm C2S base paper, resulting in 1.4 gsm dried amorphous polyester polymer was on the paper after ethyl acetate solvent was evaporated from the substrate by oven drying (FIG. 2, layer #26).

A first aluminium layer having an OD of approximately 3.0 was deposited on the first side of dry polyester polymer layer by vacuum deposition (FIG. 2, layer #24).

A third layer of a water-based acrylic polymer emulsion at 25% solids coating was applied on the aluminium layer, to protect the aluminium layer from abrasion damage, where the amount of dried acrylic polymer on the metal was around 1.0 gsm after the water was evaporated by oven drying from the coating (FIG. 2, layer #25).

A second aluminium layer having an OD of approximately 3.0 was deposited on the dry polyester polymer layer by vacuum deposition (FIG. 2, layer #27) under the same process and conditions as the first aluminium layer.

A fourth layer of a water-based acrylic polymer emulsion at 25% solids coating was applied on the aluminium layer 27 and oven dried, to protect the aluminium layer from abrasion damage, where the amount of dried acrylic polymer on the metal was around 1.0 gsm after the water was evaporated by oven drying from the coating (FIG. 2, layer #28).

The material was characterized by WVTR values between 0.77 to 1.41 g/m$^2$/day, showing a Δ=0.64 g/m$^2$/day with an average 1.13 g/m$^2$/day measured at 38° C. and relative humidity 90% with six random test samples.

Comparative Example Examples 4A-4B and Examples 4C-4E

Futamura NatureFlex™ Renewable and Compostable cellulosic double-sided heat sealable coated NVS with WVTR=600 g H$_2$O/m$^2$/day at 38° C., 90% RH and OTR=5 cc O$_2$/m$^2$/day at 23° C., 50% RH packaging films, was prepared as follows:

Single metallized sheet materials, 30NVS or 23NVS, (comparative examples 4A and 4B) are compared to multilayer metallized on one side of the sheet material 30NVS (examples 4C and 4D) according to the sequence of layers illustrated on FIG. 1 and to a multilayer metallized material where metallized layers are deposited on each side of the 30NVS substrate, according to the sequence of layers illustrated on FIG. 2 (example 4E), according to the present invention.

Comparative Example 4A (Comparative to 4C & 4E)

Single metallization directly on raw base sheets 30NVS (two WVTR test samples) and 23NVS (two WVTR test samples) with OD=2.5-4.0

An aluminium layer having an OD of approximately 3.5 was deposited on the NatureFlex™ NVS raw stocks by vacuum deposition.

A first layer of a water-based acrylic polymer emulsion at 25% solids coating or a polyester polymer dissolved into ethyl acetate was applied on the aluminium layer to protect the aluminium layer from abrasion damage, where the amount of acrylic polymer or polyester polymer after oven drying on the metal was around 1.0-1.4 gsm.

This material represents the prior art, where only one thick metal layer is present in the sheet material. The materials were characterized by WVTR values between 2.52 to 3.99 g/m$^2$/day, showing a Δ=1.47 g/m$^2$/day with an average 3.09 g/m$^2$/day measured at 38° C. and relative humidity 90% with four test samples.

Comparative Example 4B (Comparative to 4D)

Single metallization on coated sheet OD=4.1-5.4, was prepared as follows:

A first layer of polyester polymer dissolved into ethyl acetate was applied on one side of 30NVS base substrate, resulting in 1.4 gsm dried amorphous polyester polymer was on the film after ethyl acetate solvent was evaporated from the substrate by oven drying.

An aluminium layer having an OD of approximately 4.0 was deposited on the dry polyester polymer layer by vacuum deposition.

A second layer of a water-based acrylic polymer emulsion at 25% solids coating was applied on the aluminium layer and oven dried, to protect the aluminium layer from abrasion damage, where the amount of dried acrylic polymer on the metal was around 1.0 gsm after the water was evaporated by oven drying from the coating.

This material represents the prior art, where only one thick metal layer is present in the sheet material. The material was characterized by WVTR values between 2.15 to 3.15 g/m$^2$/day, showing a Δ=1.00 g/m$^2$/day with an average 2.91 g/m²/day measured at 38° C. and relative humidity 90% with two test samples.

Example 4C

Double metallization on one side with first metal deposited directly onto the raw base with final substrate OD=2.7-3.8

An aluminium layer having an OD of approximately 2.0 was deposited on the NatureFlex™ 30NVS raw stock (FIG. 1, layer #2) by vacuum deposition (FIG. 1, layer #4).

A first layer polyester polymer dissolved into ethyl acetate was applied on the aluminium layer, resulting in 1.4 gsm dried amorphous polyester polymer was on the film after ethyl acetate solvent was evaporated from the substrate by oven drying (FIG. 1, layer #5).

A second aluminium layer having an OD of approximately 2.0 was deposited on the structure by vacuum deposition (FIG. 1, layer #6) under the same process and conditions as the first aluminium layer.

A second layer polyester polymer dissolved into ethyl acetate was applied on the aluminium layer, resulting in 1.4 gsm dried amorphous polyester polymer was on the structure after ethyl acetate solvent was evaporated from the substrate by oven drying to protect the aluminium layer from abrasion damage (FIG. 1, layer #7).

The material was characterized by WVTR values between 1.23 to 1.32 g/m²/day, showing a Δ=0.09 g/m²/day with an average 1.27 g/m²/day measured at 38° C. and relative humidity 90% with two test samples.

Example 4D

Double metallization on one side with both metal layers deposited onto polyester polymer coated 30NVS with final structure OD=3.6-5.3

A first layer of polyester polymer dissolved into ethyl acetate was applied on one side of NatureFlex™ 30NVS raw stock (FIG. 1, layer #2), resulting in 1.4 gsm dried amorphous polyester polymer was on the substrate after ethyl acetate solvent was evaporated from the substrate by oven drying (FIG. 1, layer #3).

An aluminium layer having an OD of approximately 2.5 was deposited on the dried polyester polymer layer by vacuum deposition (FIG. 1, layer #4).

A second layer polyester polymer dissolved into ethyl acetate was applied on the aluminium layer, resulting in 1.4 gsm dried amorphous polyester polymer was on the film after ethyl acetate solvent was evaporated from the substrate by oven drying (FIG. 1, layer #5).

A second aluminium layer having an OD of approximately 2.5 was deposited on the structure by vacuum deposition (FIG. 1, layer #6) under the same process and conditions as the first aluminium layer.

A third layer of a water-based acrylic polymer emulsion at 25% solids coating was applied on the aluminium layer and oven dried, to protect the aluminium layer from abrasion damage, where the amount of dried acrylic polymer on the metal was around 1.0 gsm after the water was evaporated by oven drying from the coating to protect the aluminium layer from abrasion damage (FIG. 1, layer #7).

The material was characterized by WVTR values between 1.83 to 1.99 g/m²/day, showing a Δ=0.16 g/m²/day with an average 1.90 g/m²/day measured at 38° C. and relative humidity 90% with two test samples.

Example 4E

Single metallization's on both sides of 30NVS raw stock with OD=3.1-4.0 (FIG. 3)

An aluminium layer having an OD of approximately 2.5 was deposited on one side of the NatureFlex™ 30NVS raw stock (FIG. 3, layer #32) by vacuum deposition (FIG. 3, layer #34).

A first layer of a water-based acrylic polymer emulsion at 25% solids coating was applied on the aluminium layer, to protect the aluminium layer from abrasion damage, where the amount of dried acrylic polymer on the metal was around 1.0 gsm after the water was evaporated by oven drying from the coating (FIG. 3, layer #35).

A second aluminium layer having an OD of approximately 2.5 was deposited on the other side of the 30NVS substrate by vacuum deposition (FIG. 3, layer #37), under the same process and conditions as the first aluminium layer.

A second layer of a water-based acrylic polymer emulsion at 25% solids coating was applied on the aluminium layer, to protect the aluminium layer from abrasion damage, where the amount of dried acrylic polymer on the metal was around 1.0 gsm after the water was evaporated by oven drying from the coating (FIG. 3, layer #38).

The material was characterized by WVTR values between 3.90 to 4.22 g/m²/day, showing a Δ=0.32 g/m²/day with an average 4.06 g/m²/day measured at 38° C. and relative humidity 90% with two test samples.

Example 5

Figure 4:
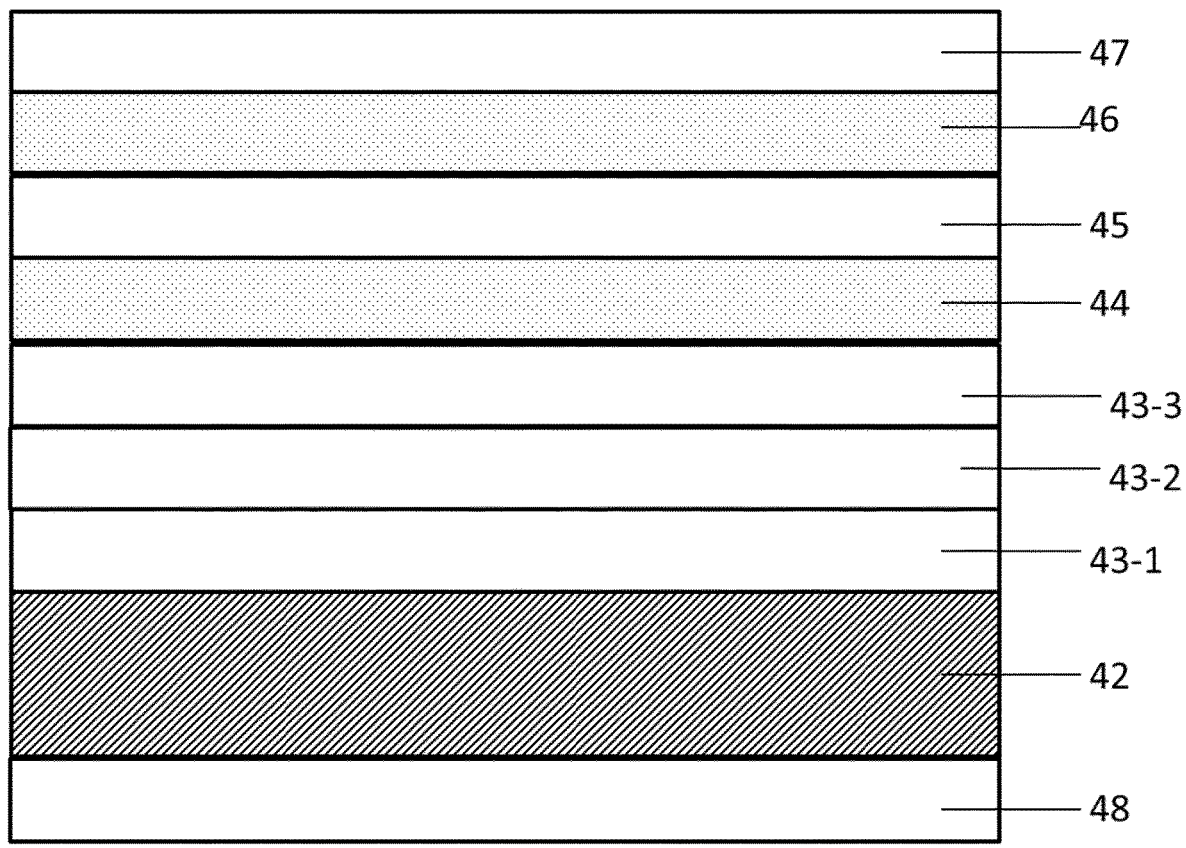
FIG. 4 illustrates further sheet material according to the invention and FIG. 5 illustrate an arrangement of two laminated sheet materials according to the invention.

White Sack Kraft Paper 70 gsm Non-Machine Finished, sheet material 5, high puncture resistance with final structure OD=3.3-4.4 (FIG. 4), was prepared as follows:

A first layer of acrylic polymer dissolved into ethyl acetate was applied on one side of White Sack Kraft Paper 70 gsm COS base paper (FIG. 4, layer #42), resulting in 2.9 gsm dried acrylic polymer on the paper after ethyl acetate solvent was evaporated from the substrate by oven drying (FIG. 4, layer #43-1).

A second layer of acrylic polymer dissolved into ethyl acetate was applied on the other side of the White Sack Kraft Paper 70 gsm COS base paper, resulting in 2.9 gsm dried acrylic polymer was on the paper after ethyl acetate solvent was evaporated from the substrate by oven drying (FIG. 4, layer #48).

A third layer of aqueous acrylic polymer emulsion at 35% solids was applied on the first side of the acrylic polymer and EVA coated White Sack Kraft Paper 70 gsm substrate, where the amount of dried acrylic polymer on the metal was around 4 gsm after the water was evaporated by oven drying from the coating (FIG. 4; layer #43-2).

A fourth layer polyester polymer dissolved into ethyl acetate was applied over the first side of the acrylic polymer, aqueous EVA and aqueous acrylic polymer coated layers resulting in 1.4 gsm dried amorphous polyester polymer was on the substrate after ethyl acetate solvent was evaporated from the substrate by oven drying (FIG. 4, layer #43-3).

An aluminium layer having an OD of approximately 2.5 was deposited on the dry polyester polymer layer by vacuum deposition (FIG. 4, layer #44).

A fifth layer polyester polymer dissolved into ethyl acetate was applied over the first metal layer, resulting in 1.4 gsm dried amorphous polyester polymer was on the substrate after ethyl acetate solvent was evaporated from the substrate by oven drying (FIG. 4, layer #45).

A second aluminium layer having an OD of approximately 2.5 was deposited on the dry polyester polymer layer by vacuum deposition (FIG. 4, layer #46) under the same process and conditions as the first aluminium layer.

A sixth layer polyester polymer dissolved into ethyl acetate was applied on the aluminium layer resulting in 1.4 gsm dried amorphous polyester polymer was on the structure after ethyl acetate solvent was evaporated from the substrate by oven drying to protect the aluminium layer from abrasion damage (FIG. 4, layer #47).

The material was characterized by WVTR values between 1.31 to 3.56 g/m$^2$/day, showing a Δ=2.25 g/m$^2$/day with an average 2.21 g/m$^2$/day measured at 38° C. and relative humidity 90% with six test samples.

Comparative Example 6—C1S—Folded

A multilayer metallized sheet material, according to the prior art, is prepared as follows:
  A first layer of polyester polymer coating dissolved into ethyl acetate was applied on the clay coated side of Pixelle Pointflex 60 gsm C1S base paper (FIG. 1, layer #2), resulting in 1.1-1.3 gsm polyester polymer on the paper after ethyl acetate solvent was evaporated by oven drying from the substrate (FIG. 1, layer #3).
  An aluminium layer such that the final product after metallization will have an OD 2.7-3.7 was deposited on the dry polyester polymer layer, by chemical vapour deposition (FIG. 1, layer #4).
  A second layer of the polyester polymer coating was applied on the aluminium layer, to protect the aluminium layer from abrasion damage, where the amount of dried polyester polymer on the structure was around 0.9-1.1 gsm after the solvent was evaporated from the substrate by oven drying (FIG. 1, layer #5).

This material represents the prior art, where only one thick metal layer is present in the sheet material, with an OD>2.5.

The material was characterized by WVTR after folding according to the set method described as follows. 180° folding of metallized WVTR barrier papers single sheets and laminated structures was accomplished by the following procedure:
  1) Metallized paper-based structure is lightly folded lining up corners at top edge and finger pushing 10 mm hard crease in the paper on a polished marble tile (300 mm×300 mm).
  2) A polished chromed surface 2 kg roller of dimensions 110 mm length with 157 mm circumference is lined up for roll crease formation on the folded sheet top 10 mm push creased area, then even speed drawn down full length of paper structure at approximately 300 mm per second.
  3) The folded sheet is hand opened and spread to overcome the substrates dead fold with crease down in contact with the polished marble tile and the 2 kg roller is placed on the top 10 mm crease opened edge prior to drawing the roller down the full length of the substrate crease at approximately 300 mm per second.
  4) Samples for WVTR Permatran-W Model 3/61 were cut maximizing the folded crease length in the testing cell.

Resulting in values between 11.79 and 19.21 g/m$^2$/day, showing a variability Δ=7.42 g/m$^2$/day with an average=15.61 g/m$^2$/day measured at 38° C. and relative humidity 90% on six selected samples.

Example 6—C1S—Folded

A multilayer metallized sheet material, according to the prior art, is prepared as follows:
  A first layer 3 of polyester polymer coating dissolved into ethyl acetate was applied on the clay coated side of Pixelle Pointflex 60 gsm C1S base paper (FIG. 1, layer #2), resulting in 1.1-1.3 gsm polyester polymer on the paper after ethyl acetate solvent was evaporated by oven drying from the substrate (FIG. 1, layer #3).
  An aluminium layer 4 having an OD of approximately 2.7-3.7 was deposited on the dry polyester polymer layer by vacuum deposition (FIG. 1, layer #4).
  A second layer 5 of the polyester polymer coating was applied on the aluminium layer 4, to protect the aluminium layer from abrasion damage, where the amount of oven dried polyester polymer on the structure was around 0.9-1.1 gsm after ethyl acetate was evaporated from the substrate by oven drying (FIG. 1, layer #5).
  A second aluminium layer 6 was deposited on the dry polyester polymer layer 5 by vacuum deposition (FIG. 1, layer #6) under the same process and conditions as the first aluminium layer (though OD of this specific layer was not measured, it is expected to be similar to the first layer).
  A third layer 7 of polyester polymer coating was applied on the aluminium layer 6, to protect the aluminium layer from abrasion damage, where the amount of dried polyester polymer on the metal was around 0.9-1.1 gsm after ethyl acetate was evaporated from the structure by oven drying (FIG. 1, layer #7).

The total thickness of aluminium layers 4 and 6 amounts to an OD of 4.5-5.0.

The material has WVTR after folding according to the set method described for Comparative example 6 resulted in values between 2.84 and 7.19 g-/m$^2$/day, showing a variability Δ=4.35 g/m$^2$/day with an average=4.77 g-/m$^2$/day measured at 38° C. and relative humidity 90% on six selected samples.

Example 7—C1S—Laminated—Flat

Figure 5:
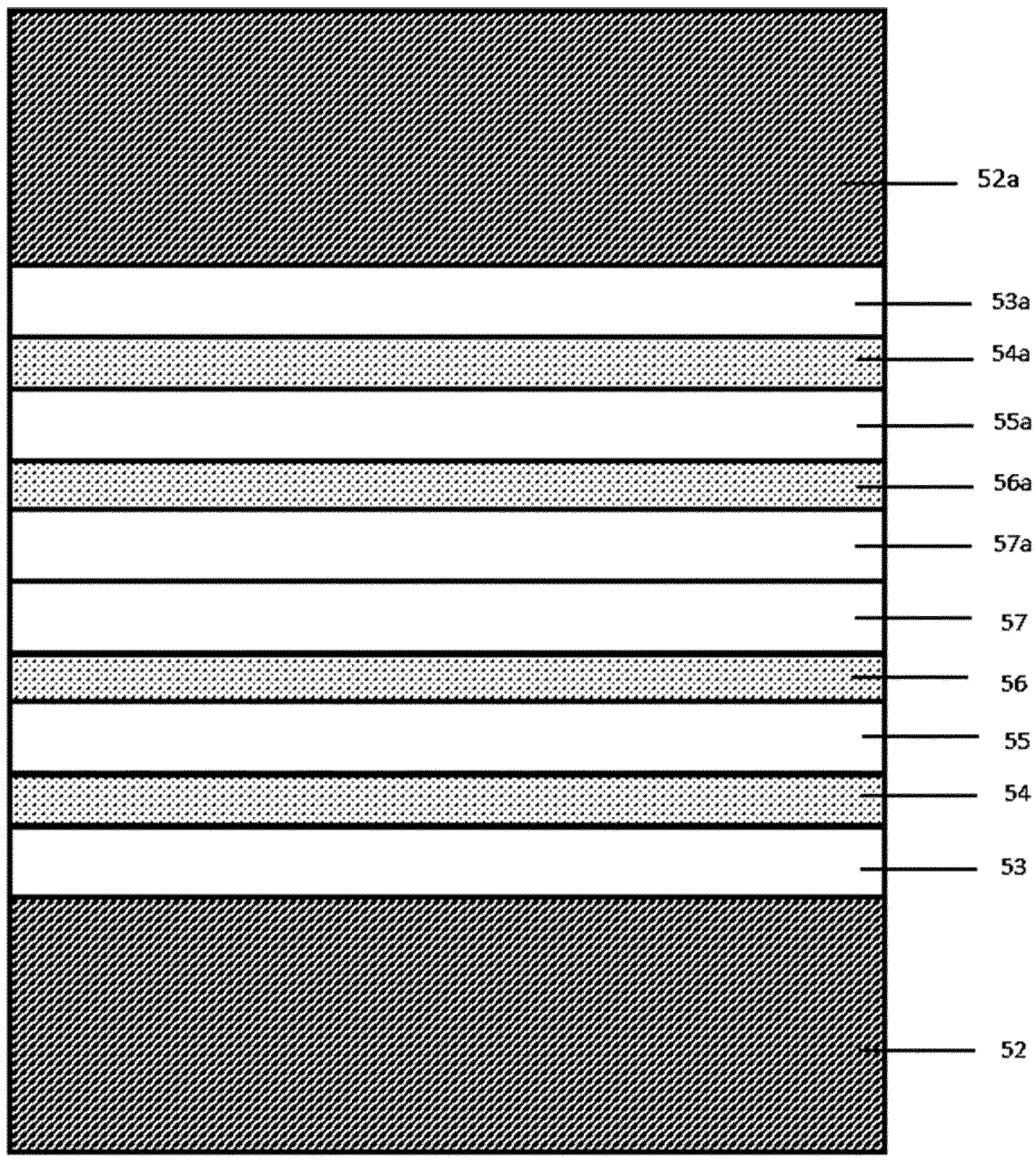

A multilayer metallized sheet material, according to the prior art, is prepared as follows:
  A first layer of polyester polymer dissolved into ethyl acetate was applied on the coated side of SAPPI Carlid 45 gsm C1S base paper (FIG. 5, layer #52), resulting in 0.8-1.2 gsm dried amorphous polyester polymer on the paper after ethyl acetate solvent was evaporated from the substrate (FIG. 5, layer #53).
  An aluminium layer having an OD of approximately 2.6 was deposited on the dry polyester polymer layer by vacuum deposition (FIG. 5, layer #54).
  A second layer 5 of the polyester polymer coating was applied on the aluminium layer, to protect the aluminium layer from abrasion damage, where the amount of oven dried polyester polymer on the structure was around 0.9 gsm after ethyl acetate was evaporated from the substrate by oven drying (FIG. 5, layer #55).

A second aluminium layer was deposited on the dry polyester polymer layer 5 by vacuum deposition (FIG. 5, layer #56) under the same process and conditions as the first aluminium layer (though OD of this specific layer was not measured, it is expected to be similar to the first layer).

A third layer of polyester polymer coating was applied on the aluminium layer, to protect the aluminium layer from abrasion damage, where the amount of dried polyester polymer on the metal was around 0.8 gsm after ethyl acetate was evaporated from the structure by oven drying (FIG. 5, layer #57).

This metallized paper was then laminated onto itself, such that the final structure further has, on top on the third layer, the following layers:
- A fourth layer of polyester polymer coating 0.8 gsm (FIG. 5, layer #57a);
- A third aluminium layer (FIG. 5, layer #56a);
- A fifth layer 5a of the polyester polymer coating (FIG. 5, layer #55a);
- A fourth aluminium layer 4a (FIG. 5, layer #54a);
- A sixth layer of polyester polymer applied on the coated side of SAPPI Carlid 45 gsm C1S base paper (FIG. 5, layer #52a) which is here the outermost layer.

The total thickness of aluminium layers 54, 56, 54a and 56a amounts to an OD of 4.0-5.1. The material has WVTR values between 0.99 and 1.47 g-/m²/day, showing a variability Δ=0.48 g/m²/day with an average=1.22 g-/m²/day measured at 38° C. and relative humidity 90%, exhibiting superior average WVTR with significantly reduced variability among nine randomly chosen test samples.

Comparative Example
8—C1S—Laminated—Folded

A single metallized layer sheet material, according to the prior art, is prepared as follows:
- A first layer of polyester polymer dissolved into ethyl acetate was applied on the coated side of Pixelle Pointflex 60 gsm C1S base paper (FIG. 5, layer #52), resulting in 1.1-1.3 gsm dried amorphous polyester polymer on the paper after ethyl acetate solvent was evaporated from the substrate (FIG. 5, layer #53).
- An aluminium layer having an OD of approximately 3.0 was deposited on the dry polyester polymer layer by vacuum deposition (FIG. 5, layer #54).
- A second layer of the polyester polymer coating was applied on the aluminium layer 4, to protect the aluminium layer from abrasion damage 1.0 gsm after ethyl acetate was evaporated from the substrate by oven drying (FIG. 5, layer #55).

This metallized paper has further been laminated to the polyester layer of a coated paper prepared as follows:
- a layer of polyester polymer dissolved into ethyl acetate was applied on the coated side of Pixelle Pointflex 60 gsm C1S base paper (FIG. 5, layer #52a), resulting in 1.1-1.3 gsm dried amorphous polyester polymer on the paper after ethyl acetate solvent was evaporated from the substrate (FIG. 5, layer #53a).

Note that layers #54a, 55a,56a, 57a, 56 and 57 in FIG. 5 are omitted from the structure of this example.

The material was characterized by WVTR after folding according to the set method described at Comparative Example 6 resulting in values between 3.22 and 17.36 g/m²/day, showing a variability Δ=14.64 g/m²/day with an average=9.29 g/m²/day measured at 38° C. and relative humidity 90%.

Example 8—C1S—Laminated—Folded

A single metallized layer sheet material, according to the prior art, is prepared as follows:
- A first layer of polyester polymer dissolved into ethyl acetate was applied on the coated side of Pixelle Pointflex 60 gsm C1S base paper (FIG. 5, layer #52), resulting in 1.1-1.3 gsm dried amorphous polyester polymer on the paper after ethyl acetate solvent was evaporated from the substrate (FIG. 5, layer #53).
- An aluminium layer having an OD of approximately 3.0 was deposited on the dry polyester polymer layer by vacuum deposition (FIG. 5, layer #54).
- A second layer of the polyester polymer coating was applied on the aluminium layer 4, to protect the aluminium layer from abrasion damage 1.0 gsm after ethyl acetate was evaporated from the substrate by oven drying (FIG. 5, layer #55).

This metallized paper has been laminated to itself, in a symmetrical manner, such that the final structure further comprises the following layers onto layer #55:
- A layer of the polyester polymer coating (FIG. 5, layer #55a).
- An aluminium layer (FIG. 5, layer #54a).
- A layer of polyester polymer applied (FIG. 5, layer #53a) on the coated side of Pixelle Pointflex 60 gsm C1S base paper (FIG. 5, layer #52a).

Note that layers #56a, 57a, 56 and 57 in FIG. 5 are omitted from the structure of this example.

The material was characterized by WVTR after folding according to the set method described at Comparative Example 6 resulting in values between 1.48 and 4.88 g/m²/day, showing a variability Δ=3.40 g/m²/day with an average=2.59 g/m²/day measured at 38° C. and relative humidity 90%.

Example 8A —C1S—Laminated—Folded

A multilayer metallized sheet material, according to the prior art, is prepared as follows:
- A first layer of polyester polymer dissolved into ethyl acetate was applied on the coated side of SAPPI Carlid 45 gsm C1S base paper (FIG. 5, layer #52), resulting in 0.8-1.2 gsm dried amorphous polyester polymer on the paper after ethyl acetate solvent was evaporated from the substrate (FIG. 5, layer #53).
- An aluminium layer having an OD of approximately 2.6 was deposited on the dry polyester polymer layer by vacuum deposition (FIG. 5, layer #54).
- A second layer of the polyester polymer coating was applied on the aluminium layer, to protect the aluminium layer from abrasion damage, where the amount of oven dried polyester polymer on the structure was around 0.9 gsm after ethyl acetate was evaporated from the substrate by oven drying (FIG. 5, layer #55).
- A second aluminium layer was deposited on the dry polyester polymer layer by vacuum deposition (FIG. 5, layer #56) under the same process and conditions as the first aluminium layer (though OD of this specific layer was not measured, it is expected to be similar to the first layer).
- A third layer of polyester polymer coating was applied on the aluminium layer, to protect the aluminium layer from abrasion damage, where the amount of dried polyester polymer on the metal was around 0.8 gsm after ethyl acetate was evaporated from the structure by oven drying (FIG. 5, layer #57).

This metallized paper has been laminated to itself, in a symmetrical manner such that the final structure has the following layers on top of layer #57:

A fourth layer of polyester polymer coating 0.8 gsm (FIG. 5, layer #57a).

A third aluminium layer (FIG. 5, layer #56a).

A fifth layer of the polyester polymer coating (FIG. 5, layer #55a).

A fourth aluminium layer (FIG. 5, layer #54a).

A sixth layer of polyester polymer applied on the coated side of SAPPI Carlid 45 gsm C1S base paper (FIG. 5, layer #52a)

The material was characterized by WVTR after folding according to the set method described at Comparative Example 6 resulting in values between 1.79 and 4.00 g/m²/day, showing a variability Δ=2.21 g/m²/day with an average=2.44 g/m²/day measured at 38° C. and relative humidity 90%.

Examples Summary Tables

| Layers in FIG. 1 | Comparative Example 1 | Comparative Example 1A | Example 1 | Example 1A | Example 2 |
|---|---|---|---|---|---|
| 7 | | | Polyester polymer solvent based | Polyester polymer solvent based | Acrylic polymer water based |
| 6 | | | Aluminium | Aluminium | Aluminium |
| 5 | Acrylic polymer solvent based | Polyester polymer solvent based | Polyester polymer solvent based | Polyester polymer solvent based | Acrylic polymer water based |
| 4 | Aluminium | Aluminium | Aluminium | Aluminium | Aluminium |
| 3 | Acrylic polymer solvent based | Polyester polymer solvent based | Polyester polymer solvent based | Polyester polymer solvent based | Acrylic polymer water based |
| 2 | One side coated (C1S) | One side coated (C1S) | One side coated (C1S) | One side coated (C1S) | One side coated (C1S) |
| Final OD | 3.5-4.0 | 2.7-3.0 | 3.5-4.0 | 3.0-3.5 | 3.8-4.1 |
| WVTR (g/m²/day) average | 8.56 | 4.81 | 0.80 | 1.08 | 2.83 |
| WVTR DELTA | 7.14 | 4.58 | 1.43 | 0.24 | 2.00 |
| WVTR min | 5.22 | 2.15 | 0.33 | 0.97 | 2.18 |
| WVTR max | 12.36 | 6.72 | 1.76 | 1.21 | 4.18 |
| Number of test samples | Six selected | Six selected | Six random | Five random | Six random |

These examples show that the multilayer metallized sheet materials of the invention enable to improve the WVTR along with reducing the variability over the surface of the material.

| Layers in FIG. 1 | Comparative Example 3A | Example 3B (cf FIG. 1) | Layers in FIG. 2 | Example 3C (cf FIG. 2) |
|---|---|---|---|---|
| 7 | | Acrylic polymer water based | | |
| 6 | | Aluminium | | |
| 5 | Acrylic polymer water based | Polyester polymer solvent based | 25 | Acrylic polymer water based |
| 4 | Aluminium | Aluminium | 24 | Aluminium |
| 3 | Polyester polymer solvent based | Polyester polymer solvent based | 23 | Polyester polymer solvent based |
| 2 | Two side coated (C2S) | Two side coated (C2S) | 22 | Two side coated (C2S) |
| | | | 26 | Polyester polymer solvent based |
| | | | 27 | Aluminium |
| | | | 28 | Acrylic polymer water based |
| Final OD | 3.8-4.2 | 4.9-5.4 | | 6.3-6.8 |
| WVTR (g H2O/m² – day) average | >20 | 0.20 | | 1.13 |
| WVTR DELTA | >108 | 0.14 | | 0.64 |
| WVTR min | 1.75 | 0.12 | | 0.77 |
| WVTR max | >110 | 0.26 | | 1.41 |
| Number of test samples | Six random | Six random | | Six random |

These examples show that the multilayer metallized sheet materials of the invention display low WVTR and low variability, both when the two aluminium layers are on the same side of the paper and on each side of the paper.

| Layers in Fig 1 | Comparative Example 4A | Comparative Example 4B | Example 4C (cf Fig 1) | Example 4D (cf Fig 1) | Layers in Fig 3 | Example 4E (cf Fig. 3) |
|---|---|---|---|---|---|---|
| 7 | | | Polyester polymer solvent based | Acrylic polymer water based | | |
| 6 | | | Aluminium | Aluminium | | |
| 5 | Polyester polymer solvent based | Acrylic polymer water based | Polyester polymer solvent based | Polyester polymer solvent based | 35 | Acrylic polymer water based |
| 4 | Aluminium | Aluminium | Aluminium | Aluminium | 34 | Aluminium |
| 3 | | Polyester polymer solvent based | | Polyester polymer solvent based | | |

-continued

| Layers in Fig 1 | Comparative Example 4A | Comparative Example 4B | Example 4C (cf Fig 1) | Example 4D (cf Fig 1) | Layers in Fig 3 | Example 4E (cf. Fig. 3) |
|---|---|---|---|---|---|---|
| 2 | NatureFlex NVS, 2 side heat-sealable | NatureFlex NVS, 2 side heat-sealable | NatureFlex NVS, 2 side heat-sealable | NatureFlex NVS, 2 side heat-sealable | 32 | NatureFlex NVS, 2 side heat-sealable |
| | | | | | 37 | Aluminium |
| | | | | | 38 | Acrylic polymer water based |
| Final OD | 2.7-4.0 | 4.1-5.4 | 2.8-3.2 | 3.6-5.3 | | 3.1-4.0 |
| WVTR (g $H_2O/m^2$/day) average | 3.09 | 2.91 | 1.27 | 1.90 | | 4.06 |
| WVTR DELTA | 1.47 | 1.00 | 0.09 | 0.16 | | 0.32 |
| WVTR min | 2.52 | 2.15 | 1.23 | 1.83 | | 3.90 |
| WVTR max | 3.99 | 3.15 | 1.32 | 1.99 | | 4.22 |
| Number of test samples | Four random | Two random | Two random | Two random | | Two random |

These examples show that the multilayer metallized sheet materials of the invention enable reduce the variability of WVTR over the surface of the material, whether the aluminium is deposited directly on the substrate or whether an intermediate layer is applied.

These examples show that the multilayer metallized sheet materials of the invention enable to improve the WVTR along with reducing the variability over the surface of the material, even after folding.

| Layers in FIG. 4 | Example 5 |
|---|---|
| 47 | Polyester polymer solvent based |
| 46 | Aluminium |
| 45 | Polyester polymer solvent based |
| 44 | Aluminium |
| 43-3 | Polyester polymer solvent based |
| 43-2 | Acrylic polymer water based |
| 43-1 | Acrylic polymer solvent based |
| 42 | White Sack Kraft, Non-MF (C0S) |
| 48 | Acrylic polymer solvent based |
| Final OD | 3.3-4.4 |
| WVTR (g $H_2O/m^2$/day) average | 2.21 |
| WVTR DELTA | 2.25 |
| WVTR min | 1.31 |
| WVTR max | 3.56 |
| Number of test samples | Six random |

| Layers in FIG. 1 | Comparative Example 6 | Example 6 |
|---|---|---|
| 2 | One side coated (C1S) | One side coated (C1S) |
| 3 | Polyester polymer solvent based | Polyester polymer solvent based |
| 4 | Aluminium | Aluminium |
| 5 | Polyester polymer solvent based | Polyester polymer solvent based |
| 6 | | Aluminium |
| 7 | | Polyester polymer solvent based |
| Final OD | 2.7-3.7 | 4.5-5.0 |
| WVTR (g $H_2O/m^2$/day) average | 15.61 | 4.77 |
| WVTR DELTA | 7.42 | 4.35 |
| WVTR min | 11.79 | 2.84 |
| WVTR max | 19.21 | 7.19 |
| Number of test samples | Six Random | Six random |

| Layers in FIG. 5 | Example 7 |
|---|---|
| 52a | One side coated (C1S) |
| 53a | Polyester polymer solvent based |
| 54a | Aluminium |
| 55a | Polyester polymer solvent based |
| 56a | Aluminium |
| 57a | Polyester polymer solvent based |
| 57 | Polyester polymer solvent based |
| 56 | Aluminium |
| 55 | Polyester polymer solvent based |
| 54 | Aluminium |
| 53 | Polyester polymer solvent based |
| 52 | One side coated (C1S) |
| Final OD | 4.0-5.1 |
| WVTR (g $H_2O/m^2$/day) average | 1.22 |
| WVTR DELTA | 0.48 |
| WVTR min | 0.99 |
| WVTR max | 1.47 |
| Number of test samples | Nine random |

This example shows that the multilayer metallized sheet materials of the invention enable to improve the WVTR along with reducing the variability over the surface of the material, after lamination.

| Layers in FIG. 5 | Comparative Example 8 | Example 8 | Example 8A |
|---|---|---|---|
| 52a | One side coated (C1S) | One side coated (C1S) | One side coated (C1S) |
| 53a | Polyester polymer solvent based | Polyester polymer solvent based | Polyester polymer solvent based |
| 54a | | Aluminium | Aluminium |
| 55a | | Polyester polymer solvent based | Polyester polymer solvent based |
| 56a | | | Aluminium |
| 57a | | | Polyester polymer solvent based |

-continued

| Layers in FIG. 5 | Comparative Example 8 | Example 8 | Example 8A |
|---|---|---|---|
| 57 | | | Polyester polymer solvent based |
| 56 | | | Aluminium |
| 55 | Polyester polymer solvent based | Polyester polymer solvent based | Polyester polymer solvent based |
| 54 | Aluminium | Aluminium | Aluminium |
| 53 | Polyester polymer solvent based | Polyester polymer solvent based | Polyester polymer solvent based |
| 52 | One side coated (C1S) | One side coated (C1S) | One side coated (C1S) |
| Final OD | 2.7-3.7 | 3.0-4.0 | 4.0-5.1 |
| WVTR (g H$_2$O/m$^2$/day) average | 9.29 | 2.59 | 2.45 |
| WVTR DELTA | 14.64 | 3.40 | 2.21 |
| WVTR min | 3.22 | 1.48 | 1.79 |
| WVTR max | 17.36 | 4.88 | 4.00 |
| Number of test samples | Eleven random | Six Random | Eleven random |

These examples show that the multilayer metallized sheet materials of the invention, obtained by lamination of two metallized sheet materials enable to improve the WVTR along with reducing the variability over the surface of the material, even after folding.

The invention claimed is:

1. A metallized multilayer sheet material for packaging having a water vapour transmission rate (WVTR) of below 5 g/m$^2$/day at 38° C. RH:90%, the metallized multilayer sheet material comprising:
    a water vapour permeable sheet substrate having a water vapour transmission rate of over 100 g/m$^2$/day at 38° C. RH:90%; and
    at least two metallized layers including a first metallized layer and a second metallized layer, each of the at least two metalized layers being covered directly by a solvent based polymeric coating layer;
    wherein the at least two metallized layers, together as cumulated metallized layers, have an optical density (OD) of at least 2.5 and a thickness of at least 15 nm.

2. The metallized multilayer sheet material of claim 1, wherein the metallized multilayer sheet material has a water vapour transmission rate of below 3 g/m$^2$/day at 38° C. RH:90%.

3. The metallized multilayer sheet material according to claim 1, further comprising a polymeric coating between the water vapour permeable substrate and the first metallized layer.

4. The metallized multilayer sheet material according to claim 1, wherein the first and the second metallized layers are on the same side of the water permeable sheet substrate.

5. The metallized multilayer sheet material according to claim 1, further comprising:
    an additional first metallized layer and an additional second metallized layer, each of the additional first metallized layer and the additional second metallized layer being covered directly by a solvent based polymeric coating layer, wherein the additional first metallized layer and the additional second metallized layer, together as additional cumulated metallized layers, have an OD of at least 2.5 and a thickness of at least 15 nm;
    wherein the first and the second metallized layers are on a first side of the water permeable sheet substrate, and
    wherein the additional first metallized layer and the additional second metallized layer are on a second side of the water permeable sheet substrate.

6. The metallized multilayer sheet material according to claim 1, wherein:
    the at least two metallized layers include the first metallized layer, the second metallized layer, and one or more additional metallized layers, each of the one or more additional metallized layers being covered directly by a solvent based polymeric coating layer; and
    the first metallized layer, the second metallized layer, and the one or more additional metallized layers, together as the cumulated metallized layers, have the OD of at least 2.5 and the thickness of at least 15 nm.

7. The metallized multilayer sheet material according to claim 1, further comprising a further aqueous based polymer coating layer applied onto the water vapour permeable substrate or between the first and the second metallized layers.

8. The metallized multilayer sheet material according to claim 1, wherein the at least two metallized layers, together as the cumulated metallized layers, have an optical density between 2.5 and 3.7, and/or a thickness between 15 nm and 100 nm.

9. The metallized multilayer sheet material according to claim 1, wherein the water vapour permeable substrate is a fibrous substrate.

10. The metallized multilayer sheet material of claim 1, wherein the metallized multilayer sheet material has a water vapour transmission rate of below 2 g/m$^2$/day at 38° C. RH:90%.

11. The metallized multilayer sheet material of claim 1, wherein the metallized multilayer sheet material has a water vapour transmission rate of below 1 g/m$^2$/day at 38° C. RH:90%.

12. The metallized multilayer sheet material according to claim 1, wherein the thickness is between 20 nm and 50 nm.

13. The metallized multilayer sheet material according to claim 1, wherein the optical density is between 3 and 4.

* * * * *